(12) United States Patent
Momose et al.

(10) Patent No.: US 12,494,451 B2
(45) Date of Patent: Dec. 9, 2025

(54) SEMICONDUCTOR DEVICE

(71) Applicant: FUJI ELECTRIC CO., LTD., Kawasaki-shi (JP)

(72) Inventors: Fumihiko Momose, Nagano (JP); Hirohisa Oyama, Matsumoto (JP); Yasuaki Hozumi, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 428 days.

(21) Appl. No.: 18/138,538

(22) Filed: Apr. 24, 2023

(65) Prior Publication Data

US 2023/0387062 A1 Nov. 30, 2023

Related U.S. Application Data

(63) Continuation of application No. PCT/JP2022/009784, filed on Mar. 7, 2022.

(30) Foreign Application Priority Data

May 18, 2021 (JP) .................. 2021-083670

(51) Int. Cl.
*H01L 23/00* (2006.01)
*H01L 23/498* (2006.01)

(52) U.S. Cl.
CPC ........ *H01L 24/29* (2013.01); *H01L 23/49866* (2013.01); *H01L 24/32* (2013.01);
(Continued)

(58) Field of Classification Search
CPC ... H01L 24/29; H01L 24/32; H01L 23/49866; H01L 2224/29083; H01L 2224/291;
(Continued)

(56) References Cited

U.S. PATENT DOCUMENTS 9,824,994 B2   11/2017   Kadoguchi
9,953,944 B2   4/2018   Ohashi et al.
(Continued)

FOREIGN PATENT DOCUMENTS

JP   2014-209608 A   11/2014
JP   2016-92063 A   5/2016
(Continued)

OTHER PUBLICATIONS

International Search Report dated May 17, 2022 for International Application No. PCT/JP2022/009784, 2 pages.
(Continued)

*Primary Examiner* — Jasmine J Clark

(57) ABSTRACT

A semiconductor device encompasses a mounting member having a copper-based wiring layer; first covering layer which contains nickel, covering the wiring layer so that a part of upper surface of the wiring layer is exposed in opening; joint layer metallurgically joined to the wiring layer in the opening; second covering layer which contains nickel, metallurgically joined to the joint layer on upper surface of the joint layer; semiconductor chip having bottom surface covered with the second covering layer. The joint layer has lower layer in contact with the wiring layer, upper layer in contact with the second covering layer, and intermediate layer between the lower layer and the upper layer, the lower layer and the upper layer have intermetallic compounds as main components which contain tin, copper and nickel, and the intermediate layer is alloy containing tin as the main component and no lead.

4 Claims, 9 Drawing Sheets

(52) U.S. Cl.
CPC .............. *H01L 2224/29083* (2013.01); *H01L 2224/29111* (2013.01); *H01L 2224/29147* (2013.01); *H01L 2224/29155* (2013.01); *H01L 2224/29564* (2013.01); *H01L 2224/29655* (2013.01); *H01L 2224/32225* (2013.01); *H01L 2924/3512* (2013.01)

(58) Field of Classification Search
CPC . H01L 2224/29147; H01L 2224/29155; H01L 2224/29564; H01L 2224/29655; H01L 2224/32225; H01L 2924/3512
USPC .......................................................... 257/666
See application file for complete search history.

(56) References Cited

U.S. PATENT DOCUMENTS

| | | | | |
|---|---|---|---|---|
| 2004/0212969 | A1* | 10/2004 | Imamura | H05K 1/111 |
| | | | | 257/E23.068 |
| 2016/0126207 | A1 | 5/2016 | Kadoguchi | |
| 2016/0276302 | A1 | 9/2016 | Ohashi et al. | |

FOREIGN PATENT DOCUMENTS

| | | |
|---|---|---|
| JP | 2018-85360 A | 5/2018 |
| JP | 2018-85366 A | 5/2018 |
| JP | 6429208 B2 | 11/2018 |
| JP | 2020-155761 A | 9/2020 |
| WO | 2016/079881 A1 | 5/2016 |

OTHER PUBLICATIONS

Written Opinion of the International Searching Authority dated May 17, 2022 for International Application No. PCT/JP2022/009784, 3 pages.

* cited by examiner

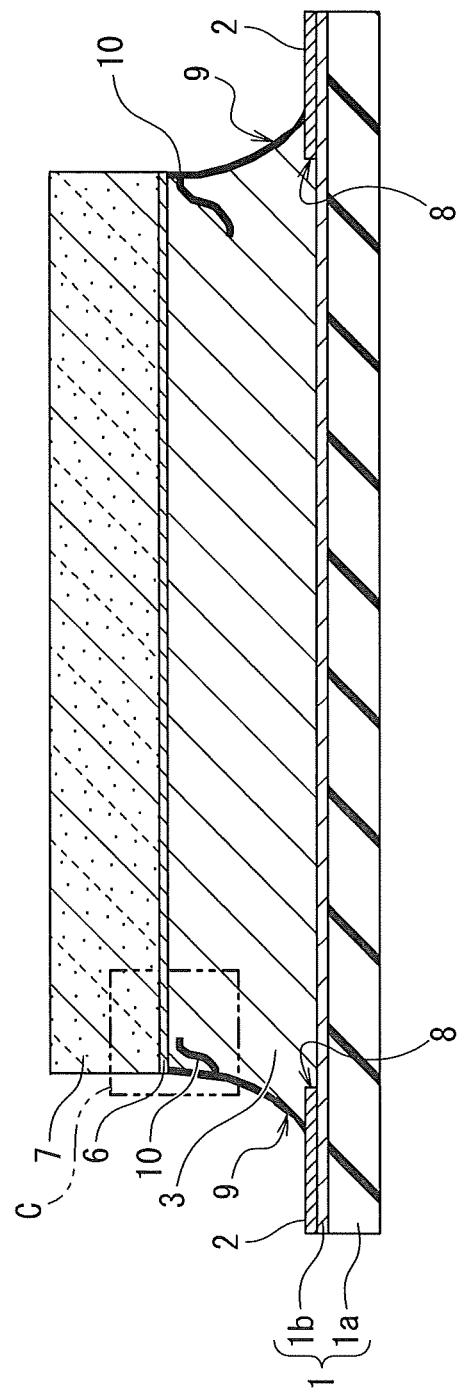

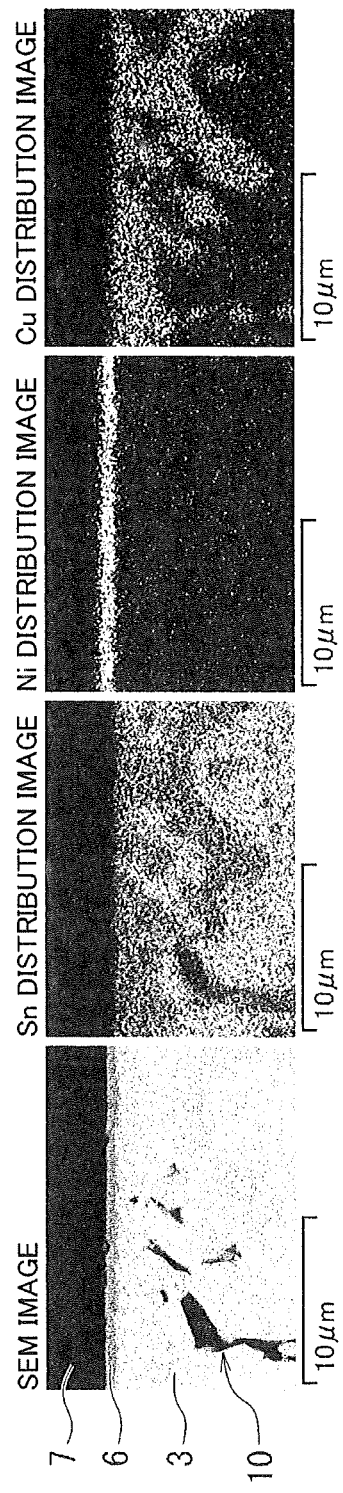

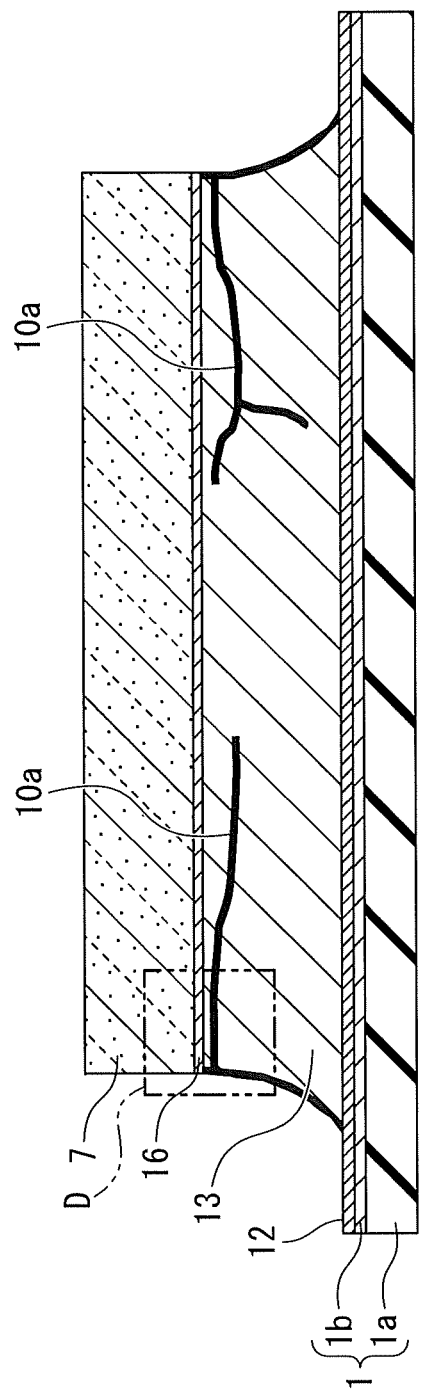

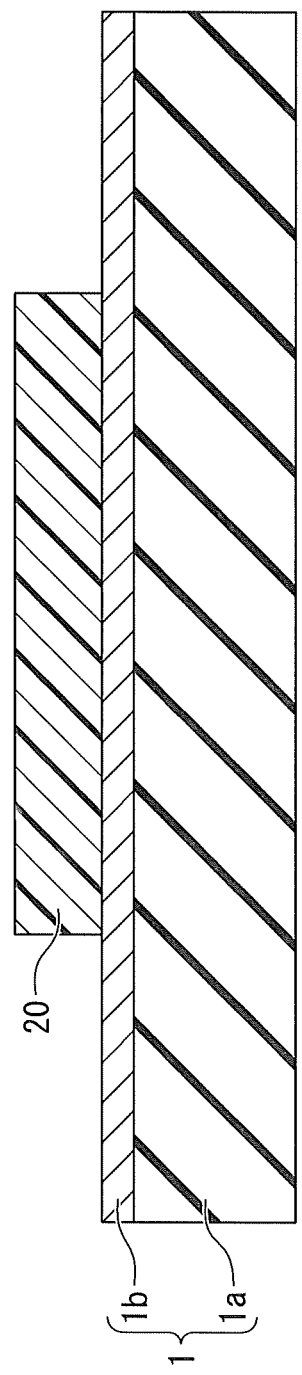

SEMICONDUCTOR DEVICE

CROSS REFERENCE TO RELATED APPLICATIONS

This application is a continuation of International Application No. PCT/JP2022/009784 filed on Mar. 7, 2022, and further claims benefit of priority under 35 USC 119 based on JP2021-083670 filed on May 18, 2021, the entire contents of which are incorporated by reference herein.

BACKGROUND OF THE INVENTION

1. Field of the Invention

The present invention relates to a semiconductor device.

2. Description of the Related Art

In a typical semiconductor device, a semiconductor chip with a semiconductor element is joined to a mounting board, such as a printed circuit board (PWB) or an insulated circuit board, a lead frame, and the like. In recent years, a lead-free (Pb-free) solder, which does not contain lead (Pb) being harmful to the environment and human body, has been widely adopted as a joining material for semiconductor devices. For example, a solder which contains a tin (Sn) as a main component (a Sn-based solder), such as a tin silver (Sn—Ag) solder and a tin antimony (Sn—Sb) solder, is used as the lead-free solder. While the conventional Sn—Pb eutectic solder has a melting point of about 183 degrees Celsius, the Sn—Ag solder has a melting point of about 40 degrees Celsius higher, and the Sn—Sb solder have a melting point of about 60 degrees Celsius higher. A metal coating, such as a copper foil and a silver brazing material, is used for the mounting board, and a nickel (Ni) plating coating is applied on the surface of the metal layer to prevent corrosion of copper (Cu) and silver (Ag) in the metal coating by hydrogen sulfide.

In a semiconductor device in which the semiconductor chip is joined with the Sn-based solder to the mounting substrate coated with Ni plating, a Ni—Sn intermetallic compound is formed in a flat layer at the interface of the joint layer. When such a semiconductor device is subjected to a temperature cycle test or a power cycle test, a crack extends parallel to the semiconductor chip from the edge of the semiconductor chip toward the inside of the joint layer, leading to premature failure of the semiconductor device.

JP 2020-155761 A describes that the joint layer formed between the Cu wiring layer of the mounting substrate and the semiconductor chip is provided with a two-layer structure of a $Cu_3Sn$ intermetallic compound layer on the Cu wiring layer side and a $(Cu, Ni)_6Sn_5$ intermetallic compound layer on the semiconductor chip side to prevent crack generation. In JP 2020-155761 A, the joining material in which a thin Ni film, a thin Sn film, a thin Ni film and a thin Cu film are stacked in order between the Cu wiring layer and the semiconductor chip is used and joining is carried out at a temperature of about 232 degrees Celsius to 400 degrees Celsius by a liquid phase diffusion bonding method.

JP 2018-85366 A and JP 2018-85360 A describe a method for forming the joint layer by placing a Cu layer between the Ni-plated member to be joined and the Sn-based solder material in order to prevent Ni leaching. JP 2018-85366 A discloses that a $Cu_6Sn_5$ or $(Cu, Ni)_6Sn_5$ compound layer is formed in the center and a $Ni_3Sn_4$ or $(Ni, Cu)_3Sn_4$ compound layer is formed in the outer periphery between the joint layer and the member to be joined. JP 2018-85360 A discloses that a $Cu_6Sn_5$ or $(Cu, Ni)_6Sn_5$ compound layer is formed between the member to be joined and a Sn-based solder layer by heating at a temperature above the solidus temperature and below the liquidus temperature of the Sn-based solder material.

JP 6429208 B describes the use of Cu-added Sn-based solder as the joining material in soldering on the Ni plated layer to form a Cu—Sn compound layer on the Ni plated layer.

When the Cu-added Sn-based solder is used, the Cu—Sn compound layer is formed at the joining interface to prevent crack extension. However, when Cu is added to the solder material, the melting point increases. Therefore, the solder joining temperature increases and the thermal deformation of the joining member increases. In addition, since the viscosity also increases, the printability of the solder material deteriorates. As a result, the assemblability of the semiconductor device is degraded.

SUMMARY OF THE INVENTION

One aspect of the present invention is provided with (a) a mounting member having a copper-based wiring layer; (b) a first covering layer which contains nickel, covering the wiring layer so that a part of an upper surface of the wiring layer is exposed in an opening; (c) a joint layer metallurgically joined to the wiring layer in the opening; (d) a second covering layer which contains nickel, metallurgically joined to the joint layer on an upper surface of the joint layer; and (e) a semiconductor chip having a bottom surface covered with the second covering layer, wherein, the joint layer has a lower layer in contact with the wiring layer, an upper layer in contact with the second covering layer, and an intermediate layer between the lower layer and the upper layer, and the lower layer and the upper layer have intermetallic compounds as main components which contain tin, copper and nickel, and the intermediate layer is an alloy containing tin as a main component and no lead.

BRIEF DESCRIPTION OF THE DRAWINGS

FIG. 5 is a schematic cross-sectional view of the semiconductor device according to the embodiment after power cycle test;

FIG. 6A is a SEM image of portion C in FIG. 5;

FIG. 6B is a Sn distribution image of the portion C in FIG. 5;

FIG. 6C is a Ni distribution image of the portion C in FIG. 5;

FIG. 6D is a Cu distribution image of the portion C in FIG. 5;

FIG. 7 is a cross-sectional schematic view of a conventional semiconductor device after power cycle test;

FIG. 9 is a schematic cross-sectional view illustrating an example of a process in a manufacturing method of the semiconductor device according to the embodiment;

DETAILED DESCRIPTION

Figure 1:
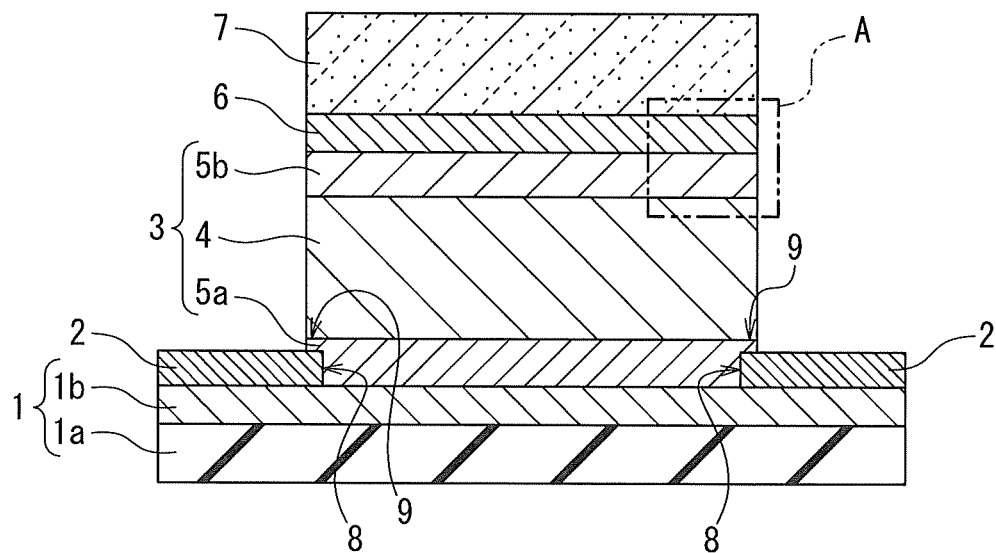
FIG. 1 is a schematic cross-sectional view illustrating an example of a semiconductor device according to an embodiment of the present invention.

Hereinafter, embodiments of the present invention will be described with reference to the drawings. In the descriptions of the drawings, the same or similar parts are denoted by the same or similar reference numerals, and duplicate explanation is omitted. However, the drawings are schematic, the relationship between the thickness and the plane dimension, the ratio of the thickness of each layer, etc. may be different from the actual one. In addition, parts having different dimensional relations and ratios may also be included between drawings. In addition, the embodiments described below exemplify apparatuses and methods for embodying the technical idea of the present invention, and the technical idea of the invention does not specify the material, shape, structure, or arrangement of the elements described below.

In the following descriptions, the terms relating to directions, such as "left and right" and "top and bottom" are merely defined for illustration purposes, and thus, such definitions do not limit the technical idea of the present invention. Therefore, for example, when the paper plane is rotated by 90 degrees, the "left and right" and the "top and bottom" are read in exchange. When the paper plane is rotated by 180 degrees, the "top" is changed to the "bottom", and the "bottom" is changed to the "top". Similarly, if the paper plane is rotated by 180 degrees, the inverted terms are defined for the relationship between "front" and "back".

As illustrated in FIG. 1, a semiconductor device according to an embodiment of the present invention includes a mounting member 1, a covering layer (first covering layer) 2, a joint layer 3, a covering layer (second covering layer) 6, and a semiconductor chip 7. The mounting member 1 has, for example, an insulating substrate 1a and a wiring layer 1b mainly composed of copper (Cu). The covering layer 2 contains nickel (Ni) and covers the wiring layer 1b. The covering layer 2 has an opening 8 where a part of an upper surface of the wiring layer 1b is exposed. The joint layer 3 has a lower layer 5a metallurgically joined to the wiring layer 1b in the opening 8 of the covering layer 2, an upper layer 5b metallurgically joined to the covering layer 6, and an intermediate layer 4 between the lower layer 5a and the upper layer 5b. The intermediate layer 4 is an alloy layer containing Sn as a main component. The covering layer 6 contains nickel (Ni) and covers a bottom surface of the semiconductor chip 7.

In the embodiment, an insulating circuit board having the wiring layer 1b on an upper surface of the insulating board 1a is exemplified as the mounting member 1. For the insulating circuit board, for example, a direct copper bonding (DCB) substrate in which copper (Cu) is eutectically bonded on the surface of the ceramic substrate, an AMB substrate in which a metal such as copper (Cu) is disposed on the surface of the ceramic substrate by the active metal brazing (AMB) method, and the like, may be adopted. For a material of the ceramic substrate, for example, silicon nitride ($Si_3N_4$), aluminum nitride (AlN), alumina ($Al_2O_3$), and the like, may be adopted. It should be noted that the mounting member 1 may be a printed circuit board (PCB) with a copper (Cu)-based wiring layer on a resin board, or a wiring member, such as a lead frame, a metal plate, a metal foil, and the like, mainly composed of copper (Cu) or aluminum (Al).

In the description of the embodiment, silicon carbide (SiC) is used for the semiconductor material of the semiconductor chip 7. Besides SiC, the semiconductor material, such as silicon (Si), gallium nitride (GaN), lonsdalite (hexagonal diamond), aluminum nitride (AlN), and the like, may be used for the semiconductor chip 7. For a semiconductor element implementing the semiconductor chip 7, a three-terminal element, such as an IGBT and a MOSFET, or a two-terminal element, such as a free-wheel diode (FWD) and a Schottky barrier diode (SBD) may be adopted. Also, for the semiconductor element, a bipolar transistor (BPT), a static induction transistor (SIT), a static induction thyristor (SI thyristor), a gate turn-off thyristor (GTO thyristor) and the like, may be adopted. From the viewpoint of corrosion resistance, the upper surface of the wiring layer 1b of the mounting member 1 and the bottom surface of the semiconductor chip 7 are covered with the covering layers 2 and 6 by Ni plating or the like, respectively.

When the semiconductor chip 7 is joined to the wiring layer 1b of the mounting member 1, the lead-free solder, which does not contain Pb being harmful to the environment and human body, is used as a joining material. For example, a Sn-based solder, which contains Sn as a main component, such as a Sn—Ag solder or Sn—Sb solder is used as the lead-free solder. In addition to the main additive elements Ag and Sb, the Sn-based solder may contain trace amounts of additive elements, such as indium (In), zinc (Zn), bismuth (Bi), magnesium (Mg) and the like. The Sn-based solder preferably does not contain Cu, but may contain Cu as long as a level of the content is trace, e.g., 0.5 mass % or less. The joining material, that is the lead-free solder, is deposited on the upper surface of the wiring layer 1b exposed in the opening 8 of the covering layer 2 illustrated in FIG. 1 by a printing technology and the like, and the semiconductor chip 7 having the bottom surface covered with the covering layer 6 is placed on the joining material. Then, in a joining process, the semiconductor chip 7 is soldered and mounted on the mounting member 1 by heating to about 260 degrees Celsius using a reflow furnace and the like. The joining material melted during soldering in the joining process gets wetting with the wiring layer 1b and the covering layer 6 so that the joining layer 3 is metallurgically joined to the wiring layer 1b exposed in the opening 8 of the covering layer 2 and metallurgically joined to the covering layer 6. As a result, the joint layer 3 is formed with the lower layer 5a in contact with the wiring layer 1b, the upper layer 5b in contact with the covering layer 6, and the intermediate layer 4 between the lower layer 5a and the upper layer 5b.

During heating of the joining material in the joining process, Cu diffuses from the wiring layer 1b and Ni diffuses from the covering layer 6, respectively, into the molten joining material. At the interface between the molten joining material and the covering layer 6, an intermetallic compound containing Sn and Ni (hereafter, also referred to as Sn—Ni compound) is generated by Ni diffusing from the covering layer 6. Concurrently, an intermetallic compound containing Sn, Cu and Ni (hereafter, also referred to as Sn—Cu—Ni (intermetallic) compound) is generated at the interface on a side of the covering layer 6 by Cu diffusing from the wiring layer 1b into the joining material, which acts as a barrier against the diffusion of Ni from the covering layer 6. Therefore, the generation of the Sn—Ni compound on the side of the covering layer 6 may be restricted. In addition, during cooling of the joining material, the Sn—Cu—Ni compound solidifies into columnar shapes at the interface between the wiring layer 1b and the covering layer 6. As a result, the lower layer 5a and the upper layer 5b each containing the Sn—Cu—Ni compound are formed in the cooled joint layer 3 as illustrated in FIG. 1. The Sn—Cu—Ni compound mainly contains $(Cu, Ni)_6Sn_5$ and may contain $Cu_3Sn$ containing trace amounts of Ni. The intermediate layer 4 is an alloy which contains Sn as a main component and no Pb. The intermediate layer 4 also contains Ag or Sb, which is included as a component of the joining material. The intermediate layer 4 may contain Cu and Ni diffused from the wiring layer 1b and the covering layer 6. Each of the lower layer 5a and the upper layer 5b has a rough surface with a plurality of columnar protrusions formed toward the intermediate layer 4. The Sn—Cu—Ni intermetallic compound implementing the lower layer 5a and the upper layer 5b has higher mechanical strength than the Sn-based alloy implementing the intermediate layer 4. From the viewpoint of corrosion resistance, it is desirable that the joining material melts in the reflow process to form a solder joint end (a fillet) 9 so as to cover the wiring layer 1b where the end of the joint layer 3 is exposed in the opening 8 of the covering layer 2 and to contact the upper surface of the covering layer 2, as illustrated in FIG. 1.

Figure 2:
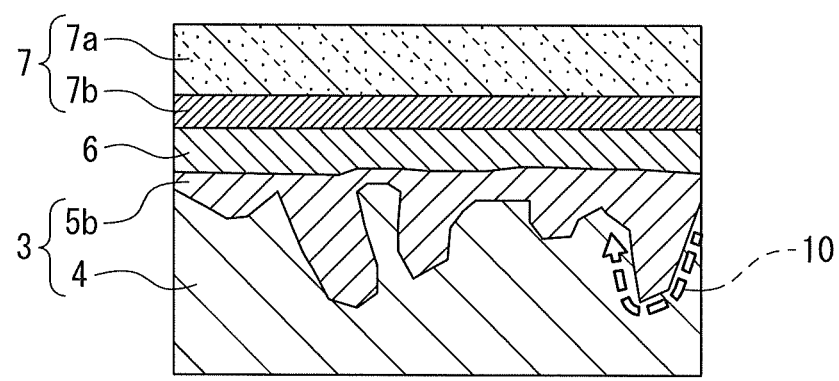
FIG. 2 is an enlarged view of portion A in FIG. 1.

FIG. 2 is an enlarged view of portion A in FIG. 1, that is, a joining portion between the covering layer 6 covering the semiconductor chip 7 and the joint layer 3. As illustrated in FIG. 2, the semiconductor chip 7 has a semiconductor layer 7a, such as SiC and the like, and an electrode layer 7b, such as titanium (Ti) and the like. At a joining interface between the covering layer 6 and the joint layer 3, a small amount of Ni leaching occurs in the covering layer 6. In addition, the upper layer 5b of the joint layer 3 has the rough surface with the columnar protrusions formed toward the intermediate layer 4. When a temperature cycle test or a power cycle test is executed on the semiconductor device, a crack 10 is generated at the joining interface near the edge of the semiconductor chip 7 due to thermal stress. Even if the generated crack 10 tends to extend into the intermediate layer 4 mainly composed of Sn having a low mechanical strength, but, as illustrated in FIG. 2, the crack 10 is forced to meander by the protrusions of the upper layer 5b mainly composed of the intermetallic compound with high mechanical strength, the crack 10 is suppressed from extending into the intermediate layer 4. In addition, although not illustrated, the lower layer 5a of the joint layer 3 also has the rough surface with the columnar protrusions formed toward the intermediate layer 4. Therefore, a crack generated at the joining interface on a side of the mounting member 1 may be also suppressed from extending into the intermediate layer 4. In addition, since the wiring layer 1b of the mounting member 1 is covered with the covering layer 2 except for the opening 8, the corrosion resistance can be ensured. Thus, in the embodiment, the Sn-based solder, such as the Sn—Ag solder or the Sn—Sb solder, in which a large amount of Cu is not added, is used as the joining material. Therefore, it is possible to prevent thermal deformation and deterioration in the printability of the solder material due to the increases in the melting point and viscosity of the joining material, and to suppress the deterioration of the assemblability of the semiconductor device.

Figure 3:
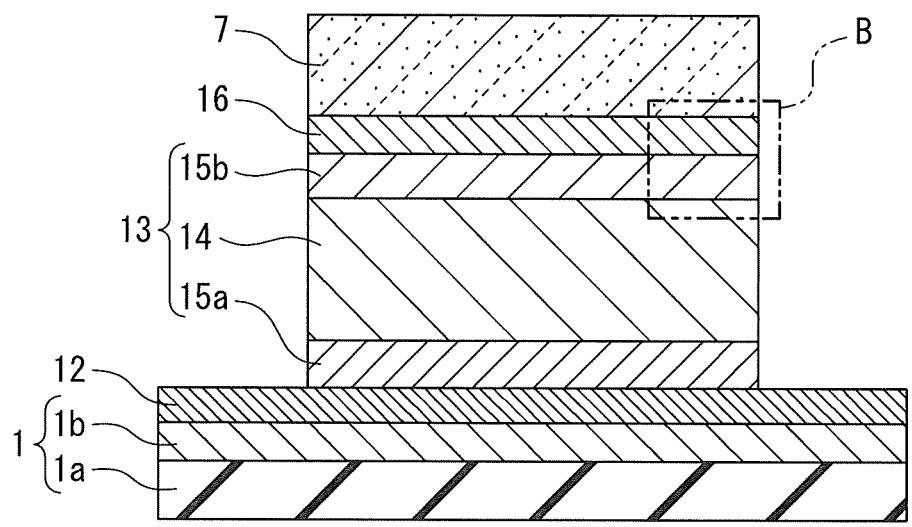
FIG. 3 is a schematic cross-sectional view illustrating an example of a conventional semiconductor device.

In the conventional semiconductor device, the entire surface of the Cu-based wiring layer of the mounting substrate is plated with Ni to ensure corrosion resistance. FIG. 3 is the cross-sectional view of the semiconductor device using the conventional mounting substrate with Ni plating. The conventional semiconductor device includes the mounting member 1, a covering layer 12, a joint layer 13, a covering layer 16, and the semiconductor chip 7, as illustrated in FIG. 3. The mounting member 1 has the insulating substrate 1a and the wiring layer 1b composed mainly of Cu. The covering layer 12 contains Ni and covers the entire upper surface of the wiring layer 1b. The joint layer 13 has a lower layer 15a metallurgically joined to an upper surface of the covering layer 12, an upper layer 15b metallurgically joined to the covering layer 16, and an intermediate layer 14 between the lower layer 15a and the upper layer 15b. The bottom surface of the semiconductor chip 7 is covered with the covering layer 16 containing Ni.

As in the embodiment, in the conventional semiconductor device, the joining material, which is the lead-free solder, is deposited on the covering layer 12 covering the upper surface of the mounting member 1 by printing technology or the like, and the semiconductor chip 7 having the bottom surface covered by the covering layer 16, is placed on the joining material. Then, in the joining process, the semiconductor chip 7 is soldered on the mounting member 1 by heating to about 260 degrees Celsius using the reflow furnace and the like. By soldering in the joining process, the joining material is metallurgically joined to the covering layer 12 and metallurgically joined to the covering layer 16. As a result, the joint layer 13 is formed with the lower layer 15a in contact with the covering layer 12, the upper layer 15b in contact with the covering layer 16, and the intermediate layer 14 between the lower layer 15a and the upper layer 15b.

During heating in the joining process, Ni diffuses into the molten joining material from each of the covering layer 12 and the covering layer 16, but Cu diffusion from the wiring layer 1b covered by the covering layer 12 is inhibited. Therefore, as illustrated in FIG. 3, intermetallic compounds containing Sn and Ni are formed in layers as the lower layer 15a and the upper layer 15b in the cooled joint layer 13. For example, as the lower layer the $Ni_3Sn_2$ intermetallic compound is mainly laminated on the side of the covering layer 12 and the $Ni_3Sn_4$ intermetallic compound is mainly laminated on the side of the intermediate layer 14. As the upper layer 15b, the $Ni_3Sn_2$ intermetallic compound is mainly laminated on the side of the covering layer 16 and the $Ni_3Sn_4$ intermetallic compound is mainly laminated on the side of the intermediate layer 14. The intermediate layer 14 of the joining layer 13 is an alloy which contains Sn as a main component and no Pb. The intermediate layer 14 also contains Ag or Sb, and Ni.

Figure 4:
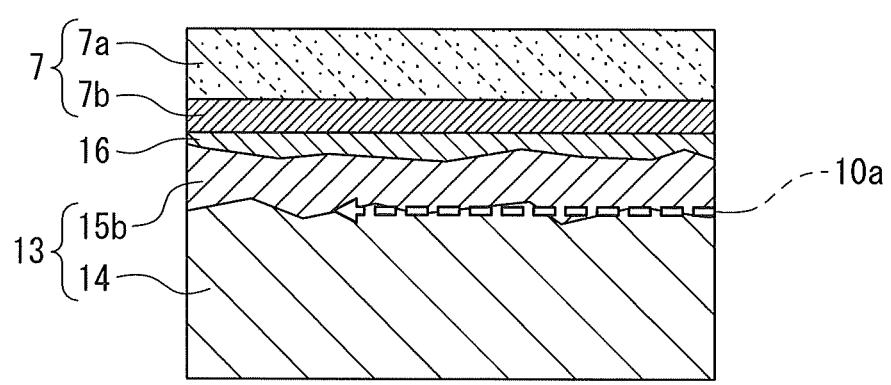
FIG. 4 is an enlarged view of portion B in FIG. 3.

FIG. 4 is an enlarged view of portion B in FIG. 3, that is, a joining portion between the covering layer 16 covering the semiconductor chip 7 and the joint layer 13. As illustrated in FIG. 4, the semiconductor chip 7 has the semiconductor layer 7a and the electrode layer 7b. At a joining interface between the covering layer 16 and the joint layer 13, a large amount of Ni leaching occurs in the covering layer 16. In addition, since the upper layer mainly composed of the Sn—Ni intermetallic compound is formed in a flat layer, a crack 10a generated at the end of the joint layer 13 easily extends in one direction through the intermediate layer 14 in parallel to the semiconductor chip 7, resulting in premature failure of the semiconductor device. Although not illustrated, a large amount of Ni leaching occurs in the covering layer 12 at the joining interface with the joint layer 13, and the lower layer 15a mainly composed of the Sn—Ni intermetallic compound is formed in a flat layer facing the intermediate layer 14.

FIG. 5 is a cross-sectional view of the semiconductor device after 100,000 cycles of power cycle test. As illustrated in FIG. 5, the fillet 9 is formed so that the end of the joint layer 3 covers the wiring layer 1b exposed in the opening 8 of the covering layer 2 and contacts the upper surface of the covering layer 2. The crack 10 generated at the interface with the joint layer 3 is localized near the edge of the semiconductor chip 7.

FIGS. 6A to 6D illustrate results observed by a scanning electron microscope and an energy dispersive X-ray analyzer (SEM/EDX) for the portion C in FIG. 5. FIG. 6A illustrates a SEM image, FIG. 6B illustrates a Sn distribution image, FIG. 6C illustrates a Ni distribution image, and FIG. 6D illustrates a Cu distribution image. As illustrated in FIG. 6A, the crack generated at the interface of the joint layer 3 near the edge of the semiconductor chip 7 after the power cycle test is restricted in extension and is localized in a minor-crack state. As illustrated in the Sn distribution image in FIG. 6B, a dark gray portion is formed in a protrusion shape near the interface of the covering layer 6 in the joint layer 3, and a gray portion is formed inside the joint layer 3. In FIG. 6B, it is estimated that the gray portion corresponds to the intermediate layer 4 having a higher Sn content, and the dark gray portion formed in the protrusion shape corresponds to the upper layer 5b having a lower Sn content than the intermediate layer 4. As illustrated in the Ni distribution image in FIG. 6C, a light gray portion is formed corresponding to the Ni-containing covering layer 6, and gray portions are scattered corresponding to the Ni precipitated in a granular shape in the joint layer 3. As illustrated in the Cu distribution image in FIG. 6D, a gray portion is formed in a protrusion shape corresponding to the upper layer 5b containing Cu. Thus, in the semiconductor device according to the embodiment, it can be seen that the upper layer 5b mainly composed of the Sn—Ni—Cu intermetallic compound is formed in the protrusion shape, and the extension of the crack 10 generated at the interface of the joint layer 3 is prevented.

FIG. 7 is a cross-sectional view of the conventional semiconductor device after 30,000 cycles of power cycle testing. As illustrated in FIG. 7, the joint layer 13 is formed on the upper surface of the covering layer 12. Cracks 10a generated at the interface with the joint layer 13 extend parallel to the semiconductor chip 7 in the joint layer 13.

Figure 8A:
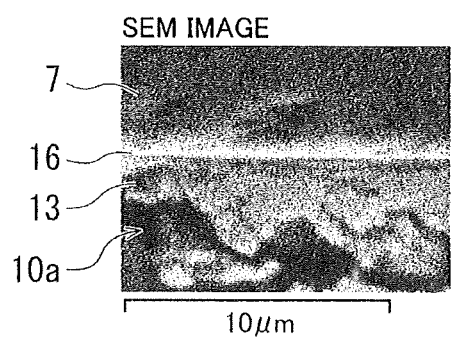
FIG. 8A is a SEM image of portion D in FIG. 7.
Figure 8B:
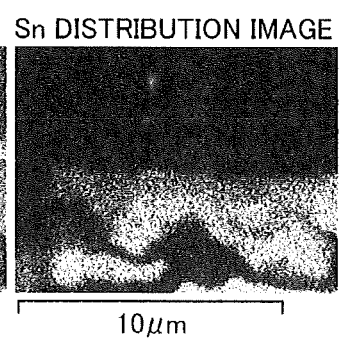
FIG. 8B is a Sn distribution image of the portion D in FIG. 7.
Figure 8C:
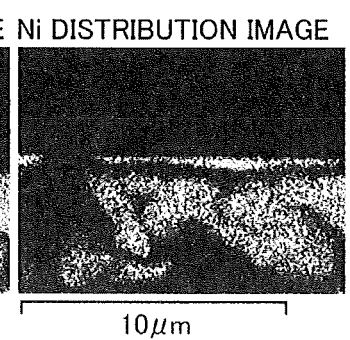
FIG. 8C is a Ni distribution image of the portion D in FIG. 7.

FIGS. 8A to 8C illustrates results observed by SEM/EDX for the portion D in FIG. 7. FIG. 8A illustrate a SEM image, FIG. 8B illustrates a Sn distribution image, and FIG. 8C illustrates a Ni distribution image. As illustrated in FIG. 8A, it can be seen that the crack 10a generated at the interface of the joint layer 13 near the edge of the semiconductor chip 7 after the power cycle test extends in the joint layer 13 parallel to the semiconductor chip 7. From the Sn and Ni distribution images of FIGS. 8B and 8C, it is estimated that Sn and Ni are distributed in layers near the interface of the covering layer 16 of the joint layer 13, and that the layer in which Sn and Ni are distributed corresponds to the upper layer 15b of the joint layer 13. Thus, in the conventional semiconductor device, since the upper layer 15b mainly composed of the Sn—Ni intermetallic compound is formed in layer, the crack 10a generated at the interface of the joint layer 13 extends into the inside of the joint layer 13 in parallel with the semiconductor chip 7, causing the premature failure of the semiconductor device.

Figure 10:
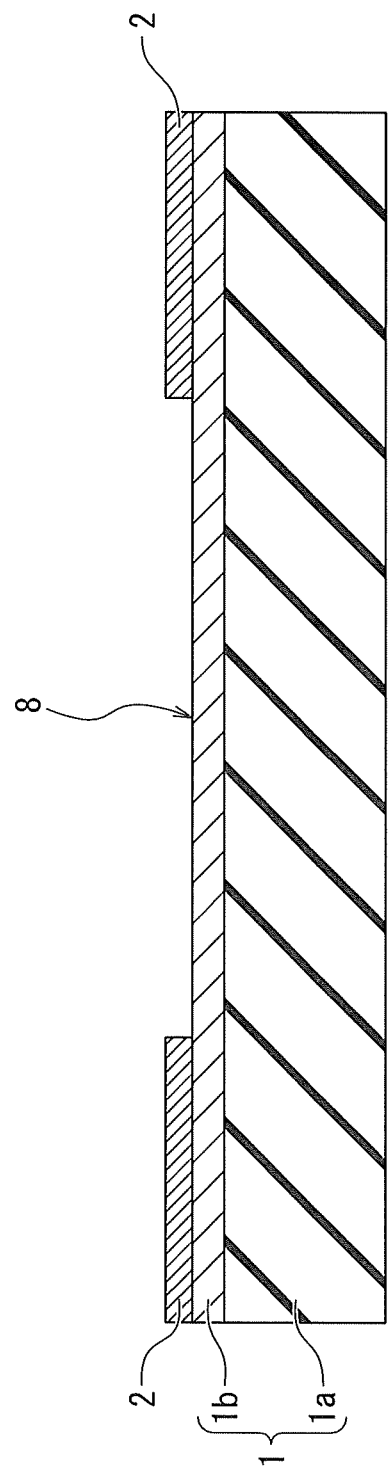
FIG. 10 is a schematic cross-sectional view illustrating an example of a process subsequent to FIG. 9 in the manufacturing method of the semiconductor device according to the embodiment.

Next, referring to FIGS. 9 to 11, a manufacturing method of the semiconductor device according to the embodiment will be given. In the following, an insulated circuit board is used as the mounting member 1, but a printed circuit board (PCB) or a wiring member, such as a lead frame, metal plate, a metal foil and the like, may be used.

First, the insulating circuit board in which the wiring layer 1b mainly composed of Cu is formed on the upper surface of the insulating substrate 1a is prepared as the mounting member 1. A photoresist film is applied on the upper surface of the wiring layer 1b, and a resist mask 20 is formed by patterning the photoresist film using a photolithography technology and the like, as illustrated in FIG. 9. Using the resist mask 20 as a plating mask, a Ni-plated layer is selectively formed on the upper surface of the wiring layer 1b. The resist mask 20 is removed to form the covering layer 2 containing Ni with the opening 8 on the upper surface of the wiring layer 1b, as illustrated in FIG. 10. In addition, after applying Ni-plating to the entire surface of the wiring layer 1b of the mounting member 1, the covering layer 2 may be provided by selectively forming the opening 8 in the Ni-plated layer by laser processing or machining. Alternatively, the covering layer 2 may be provided by selectively forming the openings 8 in the Ni-plated layer on the entire surface of the wiring layer 1b by using a photolithography technology and an etching technology.

Figure 11:
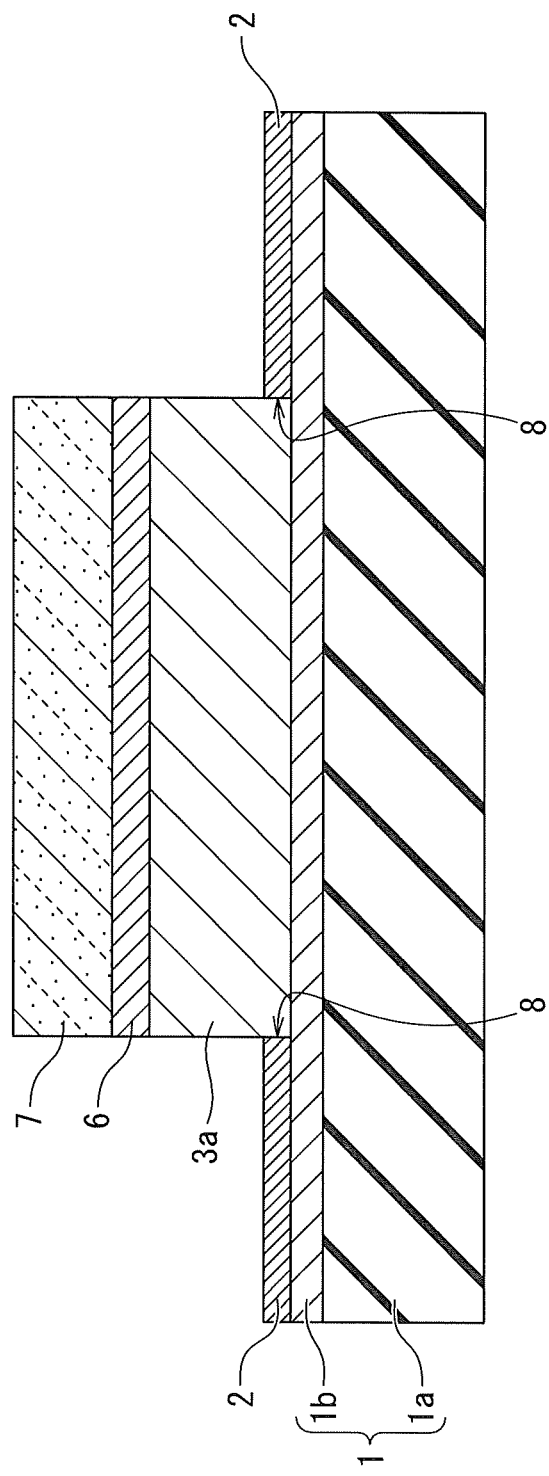
FIG. 11 is a schematic cross-sectional view illustrating an example of a process subsequent to FIG. 10 in the manufacturing method of the semiconductor device according to the embodiment.

Next, as illustrated in FIG. 11, a joining material 3a made of Sn-based lead-free solder, such as Sn—Ag solder, is deposited on the upper surface of the wiring layer 1b exposed in the opening 8 of the covering layer 2 by a printing technique or the like. A semiconductor chip 7 having the bottom surface covered with the covering layer 6 containing Ni is placed on the deposited joining material 3a. Then, in the joining process, the semiconductor chip 7 is soldered and mounted on the mounting member 1 by heating to about 260 degrees Celsius using the reflow furnace and the like. During heating by the reflow furnace, the joining material 3a melts and wets with the wiring layer 1b and the covering layer 6, and Cu from the wiring layer 1b and Ni from the covering layer 6 diffuse into the molten joining material 3a, respectively. After the joining process, the lower layer 5a, the intermediate layer 4, and the upper layer 5b are formed in the cooled joint layer 3, as illustrated in FIG. 1. The lower layer 5a is metallurgically joined to the wiring layer 1b exposed in the opening 8 of the covering layer 2. The upper layer 5b is metallurgically joined to the covering layer 6. The intermediate layer 4 is formed between the lower layer 5a and the upper layer 5b. The lower layer 5a and the upper layer 5b contain the intermetallic compounds containing Sn, Cu and Ni solidified in protruding shapes, respectively, and the intermediate layer 4 contains the alloy mainly composed of Sn. The molten joining material 3a in the joining process spreads beyond the opening 8 onto the upper surface of the covering layer 2 to form the fillet 9 at the end of the joint layer 3. Thus, the semiconductor device illustrated in FIG. 1 is completed.

In the embodiment, the upper surface of the wiring layer 1b of the mounting member 1 is selectively covered with the covering layer 2, and the Sn-based solder is deposited on the wiring layer 1b exposed in the opening 8. In the joining process, Cu is diffused from the wiring layer 1b into the molten joining material 3a to form the lower layer 5a and the upper layer 5b containing the Sn—Cu—Ni compound. The crack 10 generated near the edge of the semiconductor chip 7 is forced to meander by the protrusions of the upper layer 5b mainly composed of the Sn—Cu—Ni compound with high mechanical strength. Therefore, the extension of the crack 10 into the intermediate layer 4 can be suppressed. In addition, since the wiring layer 1b of the mounting member 1 is covered with the covering layer 2 containing Ni except for the opening 8, the corrosion resistance can be ensured. Furthermore, in the embodiment, since the Sn-based solder in which substantially Cu is not added is used, the thermal deformation due to the increases in the melting point and viscosity of the joining material 3a and the deterioration in the printability of the solder material can be prevented, and the deterioration in the assemblability of the semiconductor device can be suppressed.

(Other Embodiments)

While the present invention has been described above by reference to the embodiments and modified examples, it should be understood that the present invention is not intended to be limited to the descriptions of the Specification and the drawings implementing part of this disclosure. Various alternative embodiments, examples, and technical applications will be apparent to those skilled in the art according to the spirit and scope of the disclosure of the embodiments. It should be noted that the present invention includes various embodiments, which are not disclosed herein, including elements optionally modified as alternatives to those illustrated in the above embodiments and modified examples. Therefore, the scope of the present invention is defined only by the subject matter according to the claims reasonably derived from the description heretofore.

What is claimed is:

1. A semiconductor device comprising:
    a mounting member having a copper-based wiring layer;
    a first covering layer which contains nickel, covering the wiring layer so that a part of an upper surface of the wiring layer is exposed in an opening;
    a joint layer metallurgically joined to the wiring layer in the opening;
    a second covering layer which contains nickel, metallurgically joined to the joint layer on an upper surface of the joint layer; and
    a semiconductor chip having a bottom surface covered with the second covering layer, wherein,
    the joint layer has a lower layer in contact with the wiring layer, an upper layer in contact with the second covering layer, and an intermediate layer between the lower layer and the upper layer, and
    the lower layer and the upper layer have intermetallic compounds as main components which contain tin, copper and nickel, and the intermediate layer is an alloy containing tin as a main component and no lead.

2. The semiconductor device according to claim 1, wherein the main components of the intermetallic compounds are $(Cu, Ni)_6Sn_5$.

3. The semiconductor device according to claim 1, wherein the alloy contains silver or antimony.

4. The semiconductor device according to claim 1, wherein an end of the joint layer contacts a top surface of the first covering layer to cover the opening.

\* \* \* \* \*